United States Patent

Hörler et al.

[11] Patent Number: 4,496,252
[45] Date of Patent: Jan. 29, 1985

[54] RESILIENT SUPPORT ARRANGEMENT FOR SHAFT BEARINGS OF HIGHSPEED ROTORS, IN PARTICULAR ROTORS OF TURBO MACHINES

[75] Inventors: Hansulrich Hörler, Zurich; Rudolf Koller, Hochdorf, both of Switzerland

[73] Assignee: BBC Brown, Boveri & Company, Limited, Baden, Switzerland

[21] Appl. No.: 486,867

[22] Filed: Apr. 20, 1983

[30] Foreign Application Priority Data

May 26, 1982 [CH] Switzerland ................ 3223/82

[51] Int. Cl.³ .............................................. F16C 27/04
[52] U.S. Cl. ...................................... 384/215; 384/535
[58] Field of Search ........... 308/184 R, 184 A, 189 R, 308/207 R, 236; 384/103–106, 119, 124, 192, 215, 202, 200

[56] References Cited

U.S. PATENT DOCUMENTS

| | | | |
|---|---|---|---|
| 1,135,502 | 4/1915 | Cox | 384/200 |
| 3,473,853 | 10/1969 | Goss et al. | 308/184 R |
| 3,709,570 | 1/1973 | Galbato | 308/184 R |
| 3,960,418 | 1/1976 | Bracken | 308/184 R |

Primary Examiner—Stuart S. Levy
Assistant Examiner—David Werner
Attorney, Agent, or Firm—Burns, Doane, Swecker & Mathis

[57] ABSTRACT

The support arrangement according to the present invention has an inner strap which surrounds the ball-bearing outer race or a bush receiving the ball bearing, and an outer strap intended for installation in a casing. These two straps are connected to one another by bending spring bars uniformly distributed over the periphery of the straps, in such a way that a coaxial gap is present between them.

8 Claims, 6 Drawing Figures

RESILIENT SUPPORT ARRANGEMENT FOR SHAFT BEARINGS OF HIGHSPEED ROTORS, IN PARTICULAR ROTORS OF TURBO MACHINES

BACKGROUND AND SUMMARY OF THE INVENTION

The present invention relates to a resilient support arrangement for shaft bearings of high-speed rotors. More specifically, the present invention relates to a resilient support arrangement for shaft bearings of high speed rotors for turbo machines in which the resilient support includes spring bars.

In the case of relatively small high-speed turbo machines, in particular turbochargers with their extremely high speeds of rotation, it is necessary to attenuate the dynamic forces which act during operation on the bearing of the rotors. That is forces due to vibrations of the internal combustion engine and due to possible imbalances are generally dissipated by resilient and damping elements provided between the bearing and the casing, it being possible for the resilient elements and damping elements to be separate from one another or to be combined with one another. The present invention, however, relates only to the resilient elements of the bearing support arrangement.

Resilient annular spring packs which are assembled from corrugated concentric sheet metal sleeves, are known for this purpose. However, because of their strongly progressive spring characteristic, resilient annular spring packs do not represent the optimum, especially for large turbochargers, since in this case an inadmissably large proportion of the spring travel is sacrificed by the rotor weight alone. Although the friction between the individual sheet metal sleeves ensures a certain desired damping, this also entails undesired wear phenomena.

Bar-shaped bearing support arrangements are also known from the aircraft engine construction. In these arrangements, long axial resilient bars are present between the bearing and casing and are distributed around the periphery of the bearing, one end of the bars being anchored on the casing and the other end being anchored to a bearing sleeve which receives the ball-bearing outer race. As a result, these bars exert a moment on the casing when transverse displacement of the bearing occurs. In addition, this type of construction requires a relatively large axial installation space, so that it is not particularly suitable for relatively small turbo machines, in particular for turbochargers.

The present invention is intended to avoid the disadvantages of the known bearing support arrangements. In particular, it is intended to avoid a reaction of a moment on the bearing and to be suitable for small turbo machines. In addition, the present invention is suitable for enlarged turbochargers in which a support of such a type can be accommodated in a casing in a space-saving manner.

The present invention relates to a resilient support arrangement for shaft bearings of high speed rotors. The support arrangement includes an inner strap, an outer strap and a plurality of bending spring bars arranged around the periphery of the two straps. The spring bars extend parallel to the common axis of the two straps and are joined to the inner and outer straps. The bending spring bars have a shape such that an annular gap is present between the two straps.

BRIEF DESCRIPTION OF THE DRAWINGS

The invention is explained in more detail below by reference to illustrative embodiments of the invention, in which like elements bear like reference numerals and wherein.

DETAILED DESCRIPTION OF THE PREFERRED EMBODIMENTS

Figure 1:
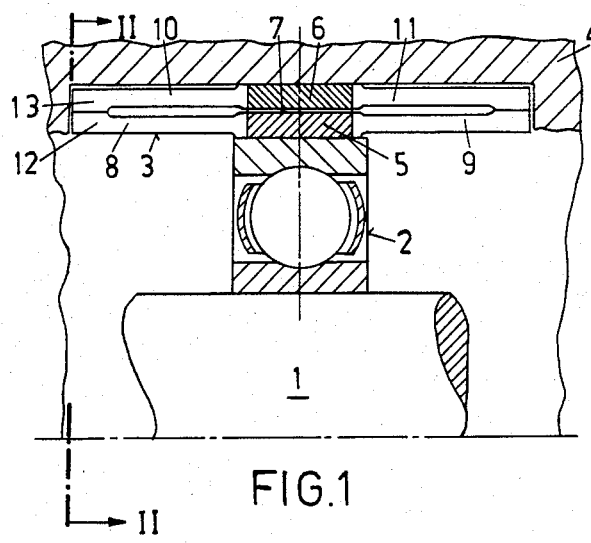
FIG. 1 is a longitudinal section of a part of a shaft bearing according to the invention for the rotor of a turbocharger.
Figure 2:
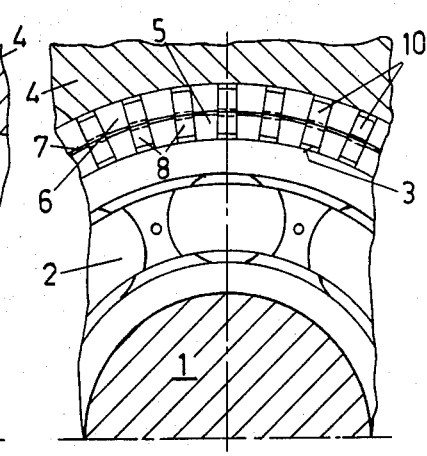
FIG. 2 is a side view corresponding to FIG. 1.

In the embodiment according to FIGS. 1 and 2, a shaft 1 of the turbocharger rotor is mounted in the casing 4 of the turbocharger by a grooved ball bearing 2 with a support arrangement 3 according to the invention. The support arrangement 3 clamped in between the outer race of the bearing 2 and a bore in the casing 4 has an inner strap 5 and an outer strap 6, between which there is a gap 7 of a radial width which is constant over the entire periphery. The two straps 5 and 6 are seated with a light press fit on the outer race of the ball bearing 2 and in the casing 4 respectively. On the two end faces of both the straps 5 and 6, inner bending spring bars 8,9 and outer bending spring bars 10,11 extend over the entire periphery in uniform distribution perpendicular to the plane of the end faces, which bending spring bars are either made integrally with their respective strap or can be joined as separately made components to the end face of the particular strap, for example by electronbeam welding. The free ends of two mutually associated bending spring bars 8 to 11 in each case can also be welded to one another, but it is also possible to join them by means of rivets, fitting pins or screws.

In FIG. 1, the two interacting free ends of the bending spring bars 8 and 10 are marked 12 and 13 respectively.

The radial width of the air gap 7 corresponds to the maximum possible deflection of the bearing 2 or of the shaft 1 at the bearing point from their central position transversely to the shaft axis, as a consequence of the disturbing forces mentioned at the outset. In the casing 4, sufficient free space should be provided on either side of the straps 5 and 6, so that the deformation of the bending spring bars is not impeded.

Figure 3:
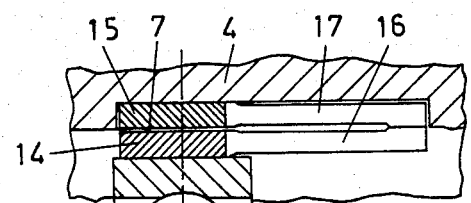
FIG. 3 is a variation of the embodiment shown in FIGS. 1 and 2, FIGS. 4 and 5 are a longitudinal section and a side view, respectively, of a second embodiment of a shaft bearing according to the invention.

In the case of relatively light-weight rotors, or if installation space in the axial direction is to be saved, the embodiment shown in FIG. 3 can be used, wherein the inner strap 14 and the outer strap 15 are provided only on one side with inner or outer bending spring bars 16 and 17.

To improve clarity, only the topmost pair of bending spring bars, located at the vertex of the support arrangement, is drawn in each case in FIGS. 1 and 3.

Figure 4:
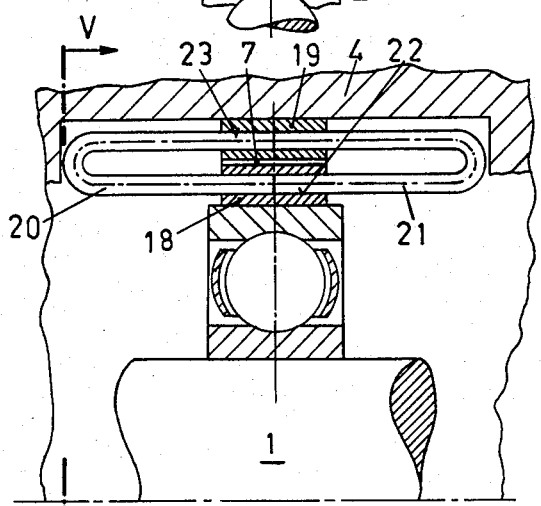
Figure 5:
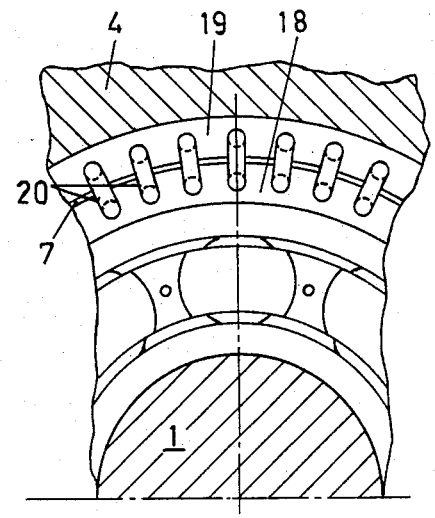
Figure 6:
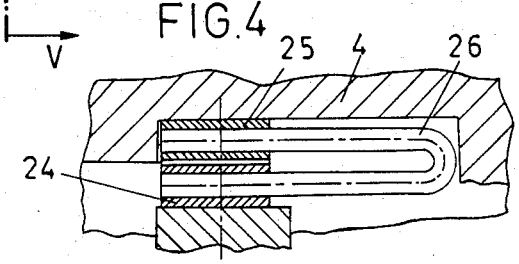
FIG. 6 is a variation of the embodiment shown in FIGS. 4 and 5.

The same also applies to FIGS. 4 and 6 for the illustration of the two further embodiments shown in FIGS. 4 and 5 or 6. In the variant according to FIGS. 4 and 5, the resilient elements include two bending spring bars 20 and 21, which have the shape of hairpins and the two arms of which are seated with a strict press fit in bores 22 or 23 in the inner strap 18 or outer strap 19 respectively.

In a simplified variant shown in FIG. 6, bending spring bars 26 in the shape of hairpins are only provided on one side, their arms likewise being pressed in the corresponding bores in the inner strap 24 or the outer strap 25.

For simplicity, the support arrangements were shown in direct contact with the ball-bearing outer race. In practice, however, the support arrangement will be combined with a bush which receives the ball bearing and/or other types of rolling bearings.

The principles, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations and changes may be made by those skilled in the art without departing from the spirit of the present invention. Accordingly, the foregoing detailed description should be considered exemplary in nature and not as limiting to the scope and spirit of the invention as set forth in the appended claims.

What is claimed is:

1. A resilient support arrangement for shaft bearings of high-speed rotors, said support arrangement being intended to resiliently absorb forces acting from the rotor upon the shaft bearing located transversely to an axis of a rotor shaft, said support arrangement including an inner strap, an outer strap and a plurality of bending spring bars arranged around the periphery of said two straps, said bending spring bars extending from end faces of said two straps in a direction generally parallel to a common longitudinal axis of the two straps, said bending bars having free ends, associated inner and outer spring bars being joined together at their free ends, the bending spring bars being of such a shape that an annular gap is present between the two straps.

2. The resilient support arrangement according to claim 1, wherein the inner and outer straps are generally circular annular cylinders and the bending spring bars are uniformly distributed around the periphery of the straps.

3. The resilient support arrangement according to claim 1, wherein the bending spring bars have a rectangular cross-section and said free ends are thickened.

4. The resilient support arrangement according to claim 1 wherein bending spring bars extend from only one of the end faces of the two straps, respectively.

5. The resilient support arrangement according to claim 1 wherein bending spring bars extend from both end faces of the inner and outer straps.

6. A resilient support arrangement for shaft bearings of high-speed rotors, said support arrangement being intended to resiliently absorb forces acting from the rotor shaft, said support arrangement including an inner strap, an outer strap and a plurality of bending spring bars arranged around the periphery of said two straps, said bending spring bars, extending generally parallel to a common longitudinal axis of the two straps and being joined to the inner and outer straps, the bending spring bars being of such a shape that an annular gap is present between the two straps, wherein the bending spring bars have a circular cross-section and are bent in the form of hairpins, parallel arms of the bending spring bars being pressed into bores in the inner strap and outer strap, respectively.

7. A resilient support arrangement for shaft bearings of high speed rotors, said support arrangement resiliently absorbing forces acting from a rotor on a shaft bearing located transversely to a longitudinal axis of a rotor shaft, said support arrangement comprising:
   an inner annular strap located at a radial distance from said rotor shaft;
   an outer annular strap located at a further radial distance from said rotor shaft, and
   a plurality of hairpin shaped bending spring bars uniformly distributed around the periphery of the inner and outer strap, said bending spring bars extending from end faces of said inner and outer straps in a direction generally parallel to the longitudinal axis of the rotor shaft, associated inner and outer spring bars being joined at their free ends, arms of the associated bending spring arms being spaced from one another so that an annular gap is defined between the inner and outer straps.

8. The resilient support arrangement of claim 7, wherein the annular gap has a constant radial width that corresponds to an approximate maximum deflection of said shaft.

* * * * *